United States Patent [19]

Ishigaki

[11] Patent Number: 4,517,518
[45] Date of Patent: May 14, 1985

[54] CIRCUIT ARRANGEMENT FOR RECONSTRUCTING NOISE-AFFECTED SIGNALS

[75] Inventor: Yukinobu Ishigaki, Tokyo, Japan

[73] Assignee: Victor Company of Japan, Ltd., Yokohama, Japan

[21] Appl. No.: 517,985

[22] Filed: Jul. 29, 1983

[30] Foreign Application Priority Data

Jul. 30, 1982 [JP] Japan ............................. 57-133298
Jul. 30, 1982 [JP] Japan ............................. 57-133299
Sep. 8, 1982 [JP] Japan ............................. 57-155237
Sep. 10, 1982 [JP] Japan ............................. 57-157751

[51] Int. Cl.³ ............................................. H03B 1/04
[52] U.S. Cl. ................................. 328/165; 330/149; 455/223
[58] Field of Search ............... 330/149; 328/151, 163, 328/165; 375/104; 455/223, 224, 303, 304

[56] References Cited

U.S. PATENT DOCUMENTS 4,076,969  2/1978  Sacks .................... 179/100.4 D
4,305,042  12/1981 Tanaka et al. ............ 328/165 X
4,311,963  1/1982  Watanabe ................ 328/163

FOREIGN PATENT DOCUMENTS

2929030  2/1980  Fed. Rep. of Germany.

Primary Examiner—James B. Mullins
Attorney, Agent, or Firm—Lowe, King, Price & Becker

[57] ABSTRACT

An analog input signal is applied to a timing circuit (2) for generating a sampling pulse in response to an impulse noise introduced to the signal and also to a first sample-and-hold circuit (7, 8, 9) through a buffer amplifier (6). The first sample-and-hold circuit includes a capacitor (7) and a switch (8) for applying the analog signal to the capacitor to develop a voltage therein which keeps track of the waveform of the analog signal in the absence of the sampling pulse and holding the voltage in response to the sampling pulse. A differentiator (11) is coupled in a feedback loop from the output of the first sample-and-hold circuit for generating a signal representative of the slope ratio of the analog signal. A second sample-and-hold circuit (15) is provided in the feedback loop for sampling and holding the slope ratio signal in response to the sampling pulse. Further included in the feedback loop is a bidirectional constant current source (20) which provides constant current charging and discharging of the capacitor (7) in response to an output signal from the second sample-and-hold circuit (15).

12 Claims, 8 Drawing Figures

CIRCUIT ARRANGEMENT FOR RECONSTRUCTING NOISE-AFFECTED SIGNALS

BACKGROUND OF THE INVENTION

The present invention relates generally to noise reduction, and in particular to a circuit for reconstructing the portion of an analog signal which is affected by an impulse noise.

One method currently available for suppressing impulse noise involves reducing the transmission gain or shutting off the transmission path as long as the noise is present in the desired signal. Another method involves detecting the amplitude of the desired signal on the rising edge of an impulse noise and retaining the detected amplitude in the presence of the impulse noise. While these methods are effective in suppressing impulse noise, the original waveform of the noise-affected part is not compensated, resulting in unnatural sound. To overcome this problem modern digital audio systems utilize linear interpolation technique to predict the original waveform of the noise-affected part by linear interpolation. This type of systems requires complicated, expensive circuitry, not suitable for moderate cost equipments.

SUMMARY OF THE INVENTION

Therefore, the primary object of the invention is to provide an inexpensive circuit arrangement that reconstructs the noise-affected portion of an analog signal by linear interpolation.

The invention provides a circuit arrangement which comprises means coupled to an input terminal to which an analog signal is applied for generating a sampling pulse in response to an impulse noise introduced into the analog signal, a buffer amplifier coupled to the input terminal, and a first sample-and-hold circuit coupled between the output of the buffer amplifier and an output terminal of the circuit arrangement. The first sample-and-hold circuit includes a capacitor and a switch for applying the analog signal to the capacitor to develop a voltage therein which keeps track of the waveform of the analog signal in the absence of the sampling pulse and holding the voltage in response to the sampling pulse. A differentiator is coupled in a feedback loop from the output of the first sample-and-hold circuit for generating a signal representative of the slope ratio of the analog signal. A second sample-and-hold circuit is provided in the feedback loop for sampling and holding the slope ratio signal in response to the sampling pulse. Further included in the feedback loop is a bidirectional constant current source which provides constant current charging and discharging of the capacitor in response to an output signal from the second sample-and-hold circuit.

BRIEF DESCRIPTION OF THE DRAWINGS

The present invention will be described in further detail with reference to the accompanying drawings, in which.

DETAILED DESCRIPTION

Figure 1:
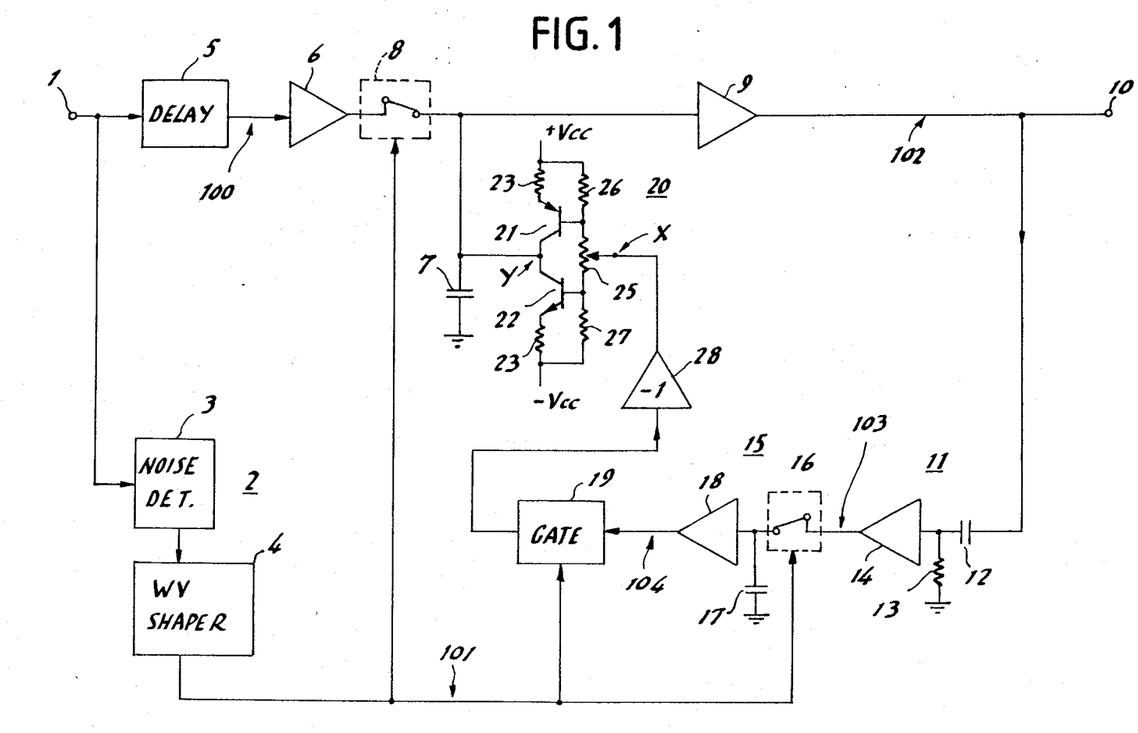
FIG. 1 is a block diagram of a first embodiment of the present invention.
Figure 2:
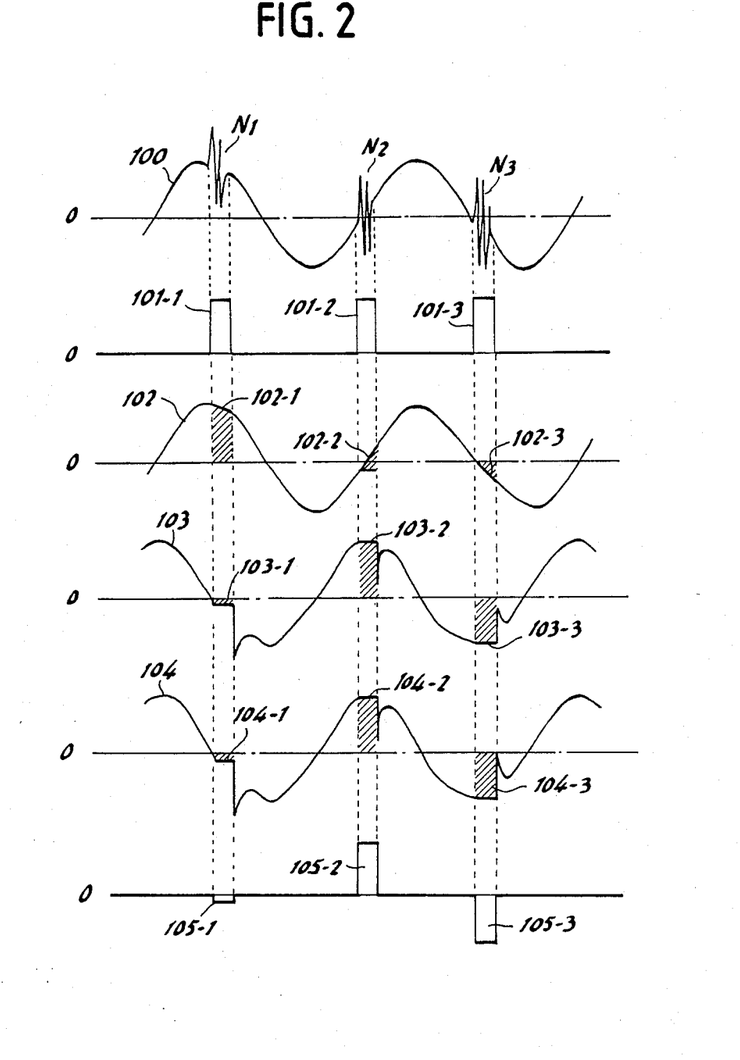
FIG. 2 is a waveform diagram useful for describing the operation of the first embodiment.

Referring now to FIG. 1, there is shown a noise suppressor according to a first embodiment of the present invention. The circuit comprises a timing circuit 2 coupled to an input terminal 1 to which a noise-affected analog audio signal shown at 100 in FIG. 2 is applied. The timing circuit 2 includes a noise detector 3 which responds to an impulse noise N introduced to the desired signal by generating an output which is reshaped by a waveshaper 4 into a rectangular sampling pulse 101. This pulse will be used for linear interpolating the noise-affected portion of the signal. The timing circuit 2 generates sampling pulses 101-1, 101-2, 101-3 in response to noise impulses $N_1$, $N_2$ and $N_3$, respectively, which occur sporadically in the form of short duration bursts at various points of the input waveform having different slopes. For purposes of illustration, the noise impulse $N_1$ is assumed to occur at a near positive peak on a downhill slope of the audio signal where its slope ratio is of a near minimum value. The impulse $N_2$ is assumed to occur at a zero-crossing point on an uphill slope of the signal where its slope ratio is maximum, and the impulse $N_3$ is assumed to occur on a downhill slope close to a zero-crossing point where the slope ratio is smaller than at the zero crossing point.

The noise suppressor of the invention operates in a tracking mode in the absence of the sampling pulse to keep track of the waveform of the analog signal for delivery to an output terminal 10 and switches to a sampling mode in response to the sampling pulse to generate a linear interpolating voltage through a feedback circuit to reconstruct the noise-affected portion of the the original signal.

A delay circuit 5, coupled to the input terminal 1, introduces a delay time corresponding to the delay time inherent in the timing circuit 2 so that the impulse noise N is time-coincident with the sampling pulse. The delayed audio signal is amplified by a first buffer amplifier 6 having a low output impedance and charged into a capacitor 7 through a normally closed analog switch 8 so that the voltage developed in capacitor 7 tracks the waveform of the input signal during tracking modes as shown at 102 in FIG. 2. The voltage developed in capacitor 7 is amplified by a second buffer amplifier 9 having a high input impedance. It is noted that the capacitor 7, switch 8 and buffer amplifier 9 form a first sample-and-hold circuit. The output of this sample-and-hold circuit is applied to the output terminal 10 and also to a differentiator 11 formed by a capacitor 12, a resistor 13 and a buffer amplifier 14.

In response to a sampling pulse 101-1 the switch 8 is open and the voltage developed in capacitor 7 is sampled and ceases to track the analog signal and held at the level immediately prior to the leading edge of the sampling pulse 101-1. By the differentiation at 11, the output of buffer amplifier 14 bears information on the slope ratio of that portion of analog signal 100 at which the impulse noise N1 occurs. This slope ratio information is represented by a voltage 103-1 and is applied to a second sample-and-hold circuit 15 including a normally closed switch 16 which is responsive to the sampling pulse 101 to sample and hold the differentiated signal, a capacitor 17 and a buffer amplifier 18. The output of the sample-and-hold circuit 15 is applied to a sampling gate 19 which opens in response to the sampling pulse 101-1 to pass the output of sample-and-hold circuit 15 to a voltage-dependent bidirectional constant current source 20 in the form of a pulse 105-1. This constant current source 20 provides constant-current charging and discharging of the capacitor 7 at a rate depending on the voltage of the input signal.

The constant current source 20 comprises a pair of transistors 21 and 22 of opposite conductivity types connected in series between a positive voltage supply +Vcc and a negative voltage supply −Vcc through resistors 23 and 24, respectively. The transistors 21 and 22 are biased by potentials developed at opposite terminals of a potentiometer 25 which are connected respectively to the voltage supplies through resistors 26 and 27. The collectors of transistors 21 and 22 are coupled together to the capacitor 7 and the tap point of the potentiometer 25 is connected to the output of the gate 19 by way of a unity gain inverting amplifier 28. The potentiometer 25 is so adjusted that for a zero voltage at a node X a zero voltage appears correspondingly at a node Y.

The operation of this constant current source is such that when a positive potential is applied thereto the transistor 21 is rendered more conductive than is transistor 22 and supplies more current to the node Y than the current drained therefrom by transistor 22. As a result, the node Y is driven to a positive potential equal to the potential developed at node X. The capacitor 7 is thus charged linearly at a rate proportional to the amplitude of the positive-going input pulse. A negative input potential, on the other hand, renders the transistor 22 more conductive than transistor 21 to drain more current from the node Y than the current supplied thereto through transistor 21, so that the node Y is driven to a negative potential equal to the potential at node X. The capacitor 7 is thus discharged linearly at a rate proportional to the amplitude of the negative going pulse.

The negative-going pulse 105-1 causes the capacitor 7 to discharge linearly at a rate proportional to the amplitude of the pulse 105-1. The noise-affected portion of the desired signal is reconstructed by a voltage interpolating the sampling period as indicated by a line segment 102-1 in FIG. 2. It will be noted that the sample-and-hold circuit 15 retains the level of the slope ratio indicative voltage during the feedback mode to prevent the interpolating voltage 102-1 from affecting the voltage input which is being applied to the constant current source 20.

In a practical embodiment, the constant current source 20 has a sufficiently high output impedance at the node Y to have little or no influence on the analog signal when the system is in tracking modes.

In response to a sampling pulse 101-2 the differentiator 11 provides a constant level output 103-2 which is sampled and held by the sample-and-hold 15 as shown at 104-2. The gate circuit 19 produces a positive-going pulse 105-2 which drives the transistor 21 more conductive than transistor 22. The capacitor 7 is charged to develop an interpolating voltage indicated by a line segment 102-2. In response to a sampling pulse 101-3 a negative constant level voltage 103-3 is detected by differentiator 11 and sampled and retained by the sample-and-hold 15 as 104-3, generating a negative-going pulse 105-3. Transistor 22 is driven more conductive to discharge the capacitor 7 to develop an interpolating voltage 102-3.

In a modified embodiment, the first amplifier 6 may have a near zero output impedance. As result of this near-zero impedance, the circuit node Y is almost driven to a ground potential during tracking modes and the tracking voltage which occurs at the node Y is reduced to a negligibly low level as compared to the desired signal. Therefore, the sampling gate 19 could be dispensed with.

In the FIG. 1 embodiment, if the impulse noise exists for a longer period that occupies a ¼ of the period of the audio signal, the slope ratio information obtained by the differentiator 11 does not necessarily represents the optimum value. For example, if such noise exsists for a period that extends from a positive peak to a zero crossing point, the output of the differentiator 11 would indicate that the noise occurs at a point where the gradient is minimum. Whereas, the noise extends down to the zero crossing point where the gradient is highest, and therefore a large difference occurs in the slope ratio value between the starting and terminating ends of such a longer duration noise, resulting in a linear interpolation inappropriate for such long duration impulses. The same holds true if the frequency of the audio signal increases.

Figure 3:
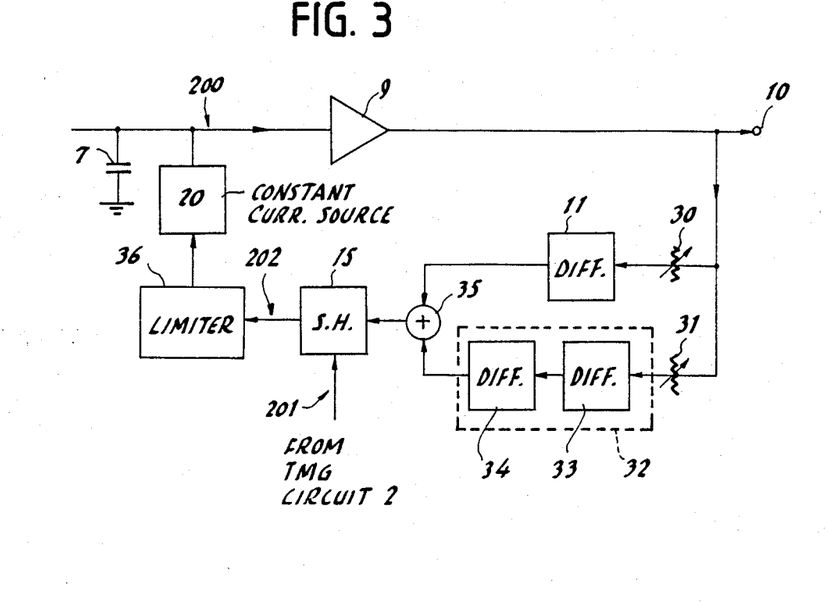
FIG. 3 is a block diagram of a second embodiment of the present invention.

To overcome this problem, the invention is modified in a manner as shown in FIG. 3 in which parts corresponding to those in FIG. 1 are marked with corresponding numerals to those in FIG. 1. The noise suppressor includes a first attenuator 30 by which the differentiator 11 is coupled to the output terminal 10, and a second attenuator 31 by which a differentiator 32 is coupled to the output terminal 10. This second differentiator includes a pair of series connected differentiators 33 and 34 to provide a derivative of second order (180 degrees advanced relative to the desired signal) to an adder 35 where it is summed with the derivative of first order (90 degrees advanced relative to the desired signal) from the differentiator 11. The attenuators 30 and 31 are manually adjusted so that the combined vector components result in a signal whose phase is shifted to an appropriately determined value which lies in a range from 90 to 180 degrees.

Figure 4:
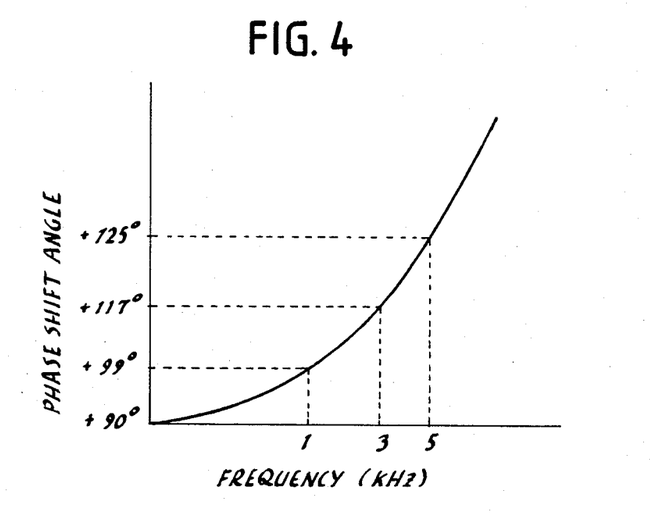
FIG. 4 is a graphic illustration of an operating characteristic associated with the second embodiment.

FIG. 4 is a graphic illustration of phase shift to be given to the output of the adder 35 as a function of the maximum frequency to which the linear interpolation is successfully applied in the case of an impulse noise having a duration of 100 microseconds. This frequency versus phase shift characteristic depends on the duration of impulse noise or the range of frequencies in which the linear interpolation is successfully applied.

In a typical example, the attenuators 30 and 31 are adjusted so that the signal at the output of adder 35 has a phase shift of 140 degrees relative to the analog signal. The output of adder 35 is applied as an input to the sample-and-hold circuit 15. The output of sample-and-hold 15 is fed to a limiter 36 which limits the amplitude of the sampled value. The amplitude limited signal is then applied as an input to the constant current source 20 to provide constant charging and discharging in a manner as described above.

Figure 5:
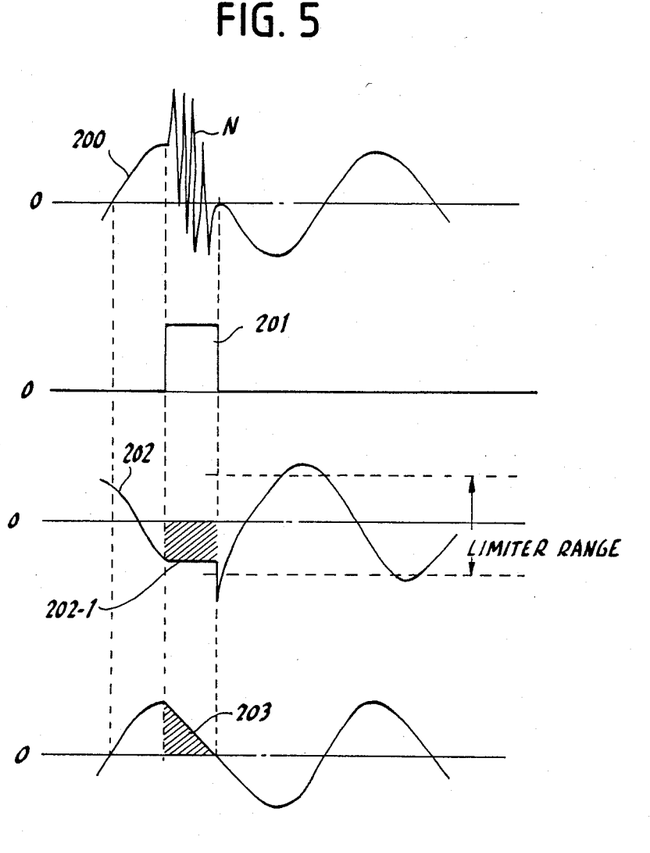
FIG. 5 is a waveform diagram associated with the second embodiment.

FIG. 5 shows a waveform diagram in which the impulse noise N occupies a period extending from a positive peak to a zero crossing point of an audio signal 200, generating a corresponding sampling pulse 201. The output of the sample-and-hold circuit 15 is shown at 202. As a result of the greater than 90-degree phase shift, the sampled value 201-1 assumes a negative value which would otherwise be derived by the FIG. 1 embodiment from an impulse noise that occurs at a midpoint on a downhill slope between a positive peak and a zero crossing point. This negative value is appropriate for linear interpolation between the positive peak and zero crossing point as shown at 203.

The differentiation of analog signal results in a signal having a frequency-dependent amplitude in the high frequency range. In particular, for a given input signal the differentiator 32 provides an output of higher amplitude due to its double differentiation than the amplitude of the signal provided by the differentiator 11. This results in a voltage inappropriate for compensating for the high frequency input signal. The effect of the limiter 36 is to limit the level of the sampled value to a predetermined value to curtail the undesired portion of the frequency-dependent amplitude of the differentiated output.

Figure 6:
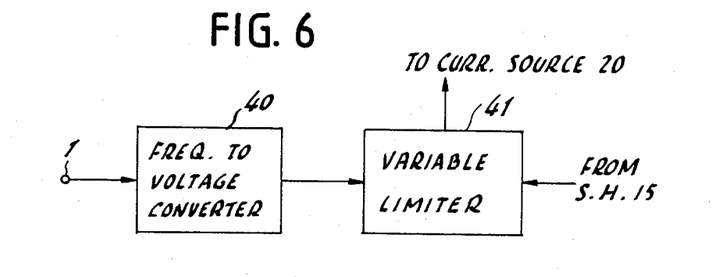
FIG. 6 is a modification of the second embodiment.

Preferably, the limiter range is controlled as a function of the frequency of the audio signal. In FIG. 6, a frequency-to-voltage converter 40 is connected to the input terminal 1 to generate a voltage proportional to the frequency and a variable range limiter 41 whose limiter range is varied in response to the voltage signal from the converter 40 so that the limiter range increases as a function of the audio frequency to compensate for the effect of the high frequency emphasis.

Figure 7:
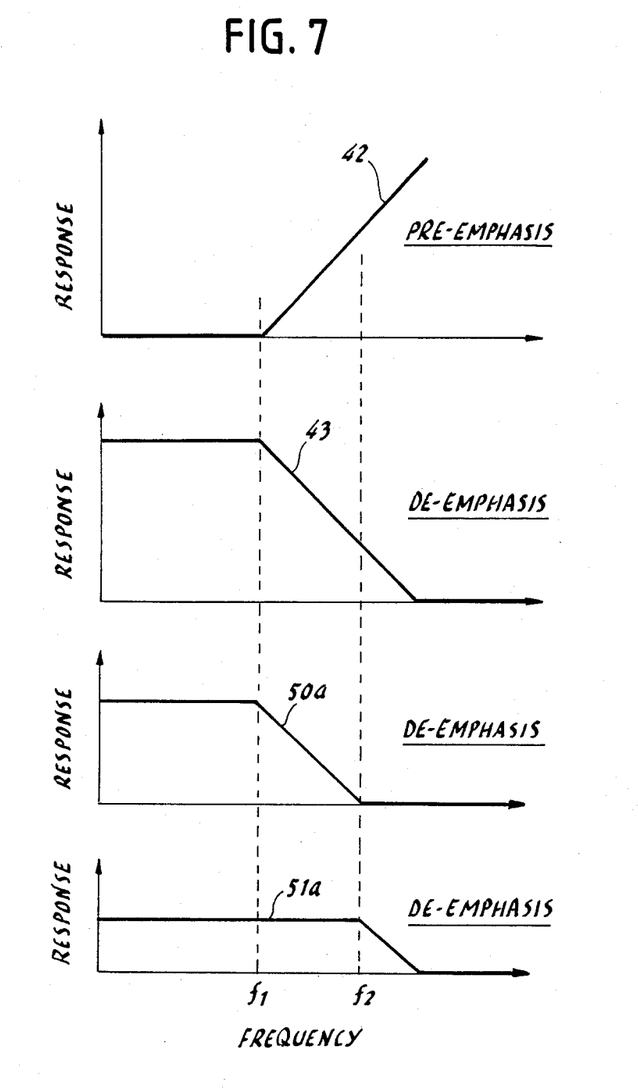
FIG. 7 is a graphic illustration of pre-emphasis and de-emphasis characteristics.

The problem of high frequency accentuation is further aggravated if the input audio signal has been derived from a frequency demodulator prior to application to the terminal 1 since it is the usual practice to pre-emphasize the modulating audio signal as shown at 42 in FIG. 7 over frequencies higher than $f_1$ in the audio spectrum prior to frequency modulation. The pre-emphasized signal must be de-emphasized upon reception by a circuit having a complementary characteristic as shown at 43 in FIG. 7. If the de-emphasis is provided after being processed through the noise suppressor, the pre-emphasized input signal would result in a higher voltage for interpolation in the high frequency range than in the lower-to-medium frequency range. If, on the other hand, the demodulated signal is de-emphasized before being applied to the input terminal 1, the impulse noise would be shaped into a longer duration waveform by a de-emphasis circuit and interpolation is no longer proper for high frequencies. However, it is found that there is an appropriate value of high-frequency pre-emphasis for linear interpolation. This can be achieved by introducing a part of the pre-emphasis to the input of the noise suppressor and introducing the remainder to the output thereof.

Figure 8:
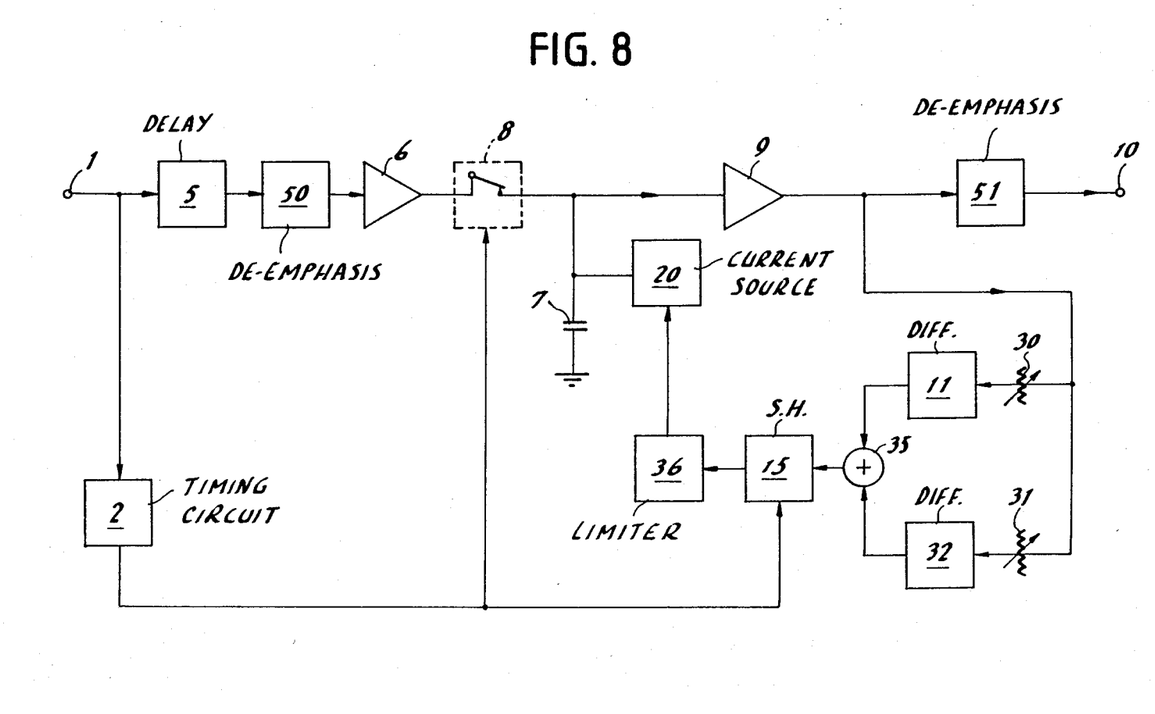
FIG. 8 is a block diagram of a third embodiment of the invention.

To this end the embodiment of FIG. 3 is modified as shown in FIG. 8. The noise suppressor of FIG. 8 additionally includes a first de-emphasis circuit 50 having a de-emphasis characteristic shown at 50a in FIG. 7 and a second de-emphasis circuit 51 having a de-emphasis characteristic shown at 51a. The de-emphasis characteristic 50a has flat responses over frequencies lower than $f_1$ and frequencies higher than $f_2$ and a de-emphasis over frequencies between $f_1$ and $f_2$. On the other hand, the characteristic 51a has a flat response over frequencies up to $f_2$ and a de-emphasis over frequencies higher than $f_2$. A combined response of these complementary characteristics corresponds to the desired de-emphasis characteristic curve 43. The first de-emphasis circuit 50 is connected between the delay circuit 5 and amplifier 6 to introduce a part of the necessary de-emphasis so that the input signal is still pre-emphasized, and the second de-emphasis circuit 51 is connected between the amplifier 9 and output terminal 10 to de-emphasize the remainder of the pre-emphasis. The attenuators 30 and 31 are coupled from the junction between the amplifier 9 and the de-emphasis circuit 51.

It is seen therefore that the pre-emphasized audio signal is partially de-emphasized by the de-emphasis circuit 50 to allow the noise suppressor to process the partially pre-emphasized signal to prevent the disadvantages of processing a fully pre-emphasized or fully de-emphasized analog signal. The second de-emphasis circuit 51 completes the necessary de-emphasis.

What is claimed is:

1. A circuit arrangement for reconstructing a noise-affected portion of an analog signal having an input terminal to which said analog signal is applied and an output terminal to which a reconstructed signal is delivered, comprising:

means coupled to said input terminal for generating a sampling pulse in response to an impulse noise introduced into said analog signal;

a buffer amplifier coupled to said input terminal;

a first sample-and-hold circuit coupled between the output of said buffer amplifier and said output terminal, said circuit having a capacitor and switching means for applying said analog signal to said capacitor to develop therein a voltage which keeps track of the waveform of said analog signal in the absence of said sampling pulse and holding said voltage in response to said sampling pulse;

a differentiator coupled in a feedback loop from the output of said first sample-and-hold circuit for generating a signal representative of the slope ratio of said analog signal;

a second sample-and-hold circuit in said feedback loop for sampling and holding said slope ratio signal in response to said sampling pulse; and means in said feedback loop for providing constant current charging and discharging of said capacitor in response to an output signal from said second sample-and-hold circuit.

2. A circuit arrangement as claimed in claim 1, further comprising delay means coupled to said input terminal for delaying said analog signal so that the delayed impulse noise is time-coincident with said sampling pulse.

3. A circuit arrangement as claimed in claim 1, further comprising gate means coupled between said second sample-and-hold circuit and said constant current charging and discharging means, said gate means being responsive to said sampling pulse to pass the output signal of said second sample-and-hold circuit to said charging and discharging means.

4. A circuit arrangement as claimed in claim 1, wherein said charging and discharging means comprises a pair of transistors of opposite conductivity types connected in a series circuit between voltage supplies of opposite polarities, a resistor network for biasing said transistors in response to an output signal from said second sample-and-hold circuit, a junction between said transistors in said series circuit being coupled to said capacitor.

5. A circuit arrangement as claimed in claim 1, wherein said buffer amplifier has an output impedance lower than an output impedance of said charging and discharging circuit, and wherein said first sample-and-hold circuit includes a buffer amplifier having an input impedance higher than the output impedance of the first-mentioned buffer amplifier.

6. A circuit arrangement as claimed in claim 1, further comprising a pair of second and third differentiators connected in a series circuit from the output of said first sample-and-hold circuit to generate a derivative of the second order, and adder for summing said slope ratio signal with said derivative and applying a combined output to said second sample-and-hold circuit, first and second adjustable attenuator means respectively connected in circuit with the first-mentioned differentiator and said pair of series connected differentiators for proportioning the amplitudes of the inputs to said adder relative to each other.

7. A circuit arrangement as claimed in claim 6, further comprising limiter means coupled in said feedback loop for limiting the amplitude of said slope ratio signal.

8. A circuit arrangement as claimed in claim 7, wherein said analog signal has been pre-emphasized prior to application to said input terminal, further comprising a first and second de-emphasis circuits having complementary de-emphasizing characteristics, said first de-emphasis circuit being coupled between said input terminal and the input of said buffer amplifier and said second de-emphasis circuit being coupled between the output of said first sample-and-hold circuit and said output terminal, said differentiator being coupled from a junction between said first sample-and-hold circuit and said output terminal.

9. A circuit arrangement as claimed in claim 6, wherein said analog signal has been pre-emphasized prior to application to said input terminal, further comprising a first and second de-emphasis circuits having complementary de-emphasizing characteristics, said first de-emphasis circuit being coupled between said input terminal and the input of said buffer amplifier and said second de-emphasis circuit being coupled between the output of said first sample-and-hold circuit and said output terminal, said differentiator being coupled from a junction between said first sample-and-hold circuit and said output terminal.

10. A circuit arrangement as claimed in claim 1, further comprising means for converting the frequency of said analog signal to a voltage signal and limiter means having a limiter level variable in response to said voltage signal, said limiter means being coupled in said feedback loop to limit the amplitude of said slope ratio signal.

11. A circuit arrangement as claimed in claim 10, wherein said analog signal has been pre-emphasized prior to application to said input terminal, further comprising a first and second de-emphasis circuits having complementary de-emphasizing characteristics, said first de-emphasis circuit being coupled between said input terminal and the input of said buffer amplifier and said second de-emphasis circuit being coupled between the output of said first sample-and-hold circuit and said output terminal, said differentiator being coupled from a junction between said first sample-and-hold circuit and said output terminal.

12. A circuit arrangement as claimed in claim 1, wherein said analog signal has been pre-emphasized prior to application to said input terminal, further comprising a first and second de-emphasis circuits having complementary de-emphasizing characteristics, said first de-emphasis circuit being coupled between said input terminal and the input of said buffer amplifier and said second de-emphasis circuit being coupled between the output of said first sample-and-hold circuit and said output terminal, said differentiator being coupled from a junction between said first sample-and-hold circuit and said output terminal.

* * * * *